United States Patent [19]

Dorler et al.

[11] 3,769,559

[45] Oct. 30, 1973

[54] NON-VOLATILE STORAGE ELEMENT

[75] Inventors: Jack A. Dorler, Wappingers Falls; John L. Forneris, Peekskill; Donald J. Swietek, Wappingers Falls, all of N.Y.

[73] Assignee: International Business Machines Corporation, Armonk, N.Y.

[22] Filed: June 21, 1972

[21] Appl. No.: 265,103

[52] U.S. Cl.... 317/234 R, 317/235 UA, 317/235 P, 29/586

[51] Int. Cl. .......... H01l 9/06, H01l 7/00

[58] Field of Search .......... 317/234 V, 235 UA, 317/235 P, 235 K; 29/584–586

[56] References Cited

UNITED STATES PATENTS

| | | | |
|---|---|---|---|
| 3,336,514 | 8/1967 | Hiatt et al. | 317/235 |
| 3,480,843 | 11/1969 | Richardson | 317/235 |
| 3,519,999 | 7/1970 | Gregor | 317/235 |

OTHER PUBLICATIONS

IBM Tech. Discl. Bul. "Nonvolative Small Area Memory" by Moser, Vol. 14, No. 12, pages 3724–3725, May 1972.

*Primary Examiner*—Jerry D. Craig
*Attorney*—Kenneth R. Stevens et al.

[57] ABSTRACT

A process for forming a non-volatile storage element having symmetrical characteristics comprising the steps of forming a pair of back-to-back Schottky barrier diodes on a monolithic substrate and selectively passing current between the Schottky barrier diodes in opposite directions in order to form a non-volatile bistable storage element.

7 Claims, 6 Drawing Figures

NON-VOLATILE STORAGE ELEMENT

RELATED INVENTIONS

Swiss application No. 14201/71, filed Sept. 30, 1971, and U.S. Patent application Ser. No. 46943, filed June 17, 1970, assigned to the same assignee as the present invention, describe distinct types of non-volatile storage devices.

BACKGROUND OF THE INVENTION

Electric switching between a high impedance state and a low impedance state has been observed in thin layers of various materials. Some of these are $Nb_2O_5$, NiO, Chalcogenide glasses, GaAs, $TiO_2$, transition metal doped glasses, and a variety of other insulators.

Switching and memory action in semiconductor devices has been reported for compensated and uncompensated germanium at a temperature of 20° Calvin in "Proceedings IRE", Vol. 47, 1959, Pages 1207–1213. Also, in "Applied Physics Letter," 1970, Vol. 17, No. 4, Pages 141–143, a bistable device is described and comprises a heterojunction of ZNSE-GE, ZNSE-GASAS, GAP-GE, or GAP-SI which operates at ambient conditions.

However, a disadvantage of these previously mentioned devices resides in their manufacturing and electrical characteristic incompatibility vis-a-vis present day semiconductor integrated circuit technology.

SUMMARY OF THE INVENTION

It is therefore an object of the present invention to provide a non-volatile bistable storage element which maintains its non-volatility over a long period of time.

Another object of the present invention is to provide a non-volatile bistable storage element which can be monolithically implemented in high densities without excessive power consumption.

Another object of the present invention is to provide a high speed non-volatile bistable storage element which operates at high speeds and can be reliably fabricated in monolithic form.

A further object of the present invention is to provide a non-volatile bistable storage element which is compatible with present day semiconductor integrated circuit technology and more particularly to Schottky barrier diode integrated circuit technology.

Another object of the present invention is to provide a non-volatile bistable storage element which can be fabricated on a monolithic silicon substrate.

Another object of the present invention is to provide a process for forming a non-volatile bistable storage element having symmetrical V-I characteristics.

In accordance with the aforementioned objects, the present invention provides a process for forming a non-volatile storage element having symmetrical electrical characteristics compatible with existing integrated circuit technology comprising the steps of selecting a monolithic substrate, forming at least one pair of back-to-back Schottky barrier diodes on the monolithic substrate, and selectively passing current in both directions through the pair of back-to-back Schottky barrier diodes in order to fabricate a high and low impedance bistable storage element.

DESCRIPTION OF THE PREFERRED EMBODIMENT

Figure 1:
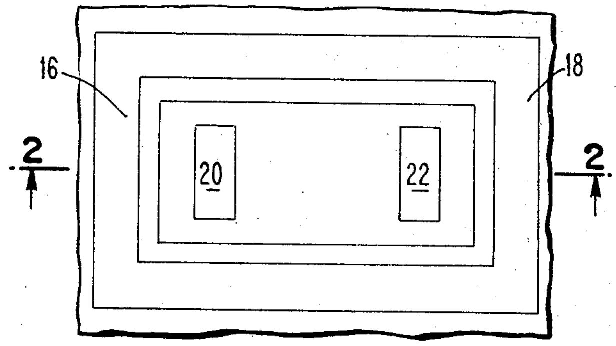
FIG. 1 is a plan view, partially broken away, illustrating a pair of back-to-back monolithic integrated circuit Schottky barrier diodes used as a starting device to form the resulting non-volatile-storage device of the present invention.
Figure 2:
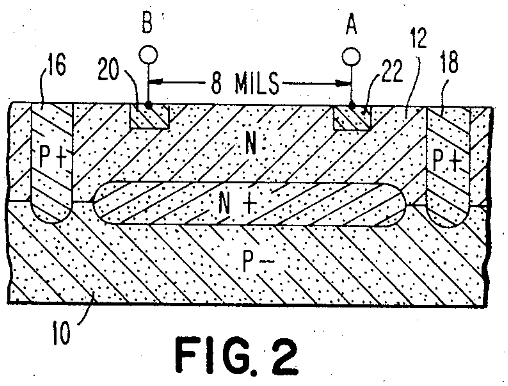
FIG. 2 is a cross-sectional view taken along lines 1—1 of FIG. 1.
Figure 5:
FIG. 5 is an electrical schematic diagram illustrating the structure of FIGS. 1 and 2.

Now referring to FIGS. 1 and 2, they illustrate a pair of back-to-back diodes fabricated in accordance with prior art monolithic integrated circuit techniques. A monolithic substrate 10 and an N type epitaxial region 12 are formed in accordance with well known integrated circuit techniques. A pair of P+ regions 16 and 18 provide electrical isolation for a pair of back-to-back Schottky barrier diodes schematically indicated at 20 and 22. A pair of contacts are made to the Schottky diodes 20 and 22, schematically labelled as B and A, respectively. Suitable process details for forming the Schottky barrier diodes 20 and 22 is fully set forth in U.S. Application Ser. No. 209,958, filed Dec. 20, 1971, and assigned to the same assignee as the present invention. The electrical schematic for the pair of Schottky barrier diodes 20 and 22 is illustrated in FIG. 5. In the preferred embodiment conacts A and B are by way of example spaced apart 8 mils.

Figure 3:
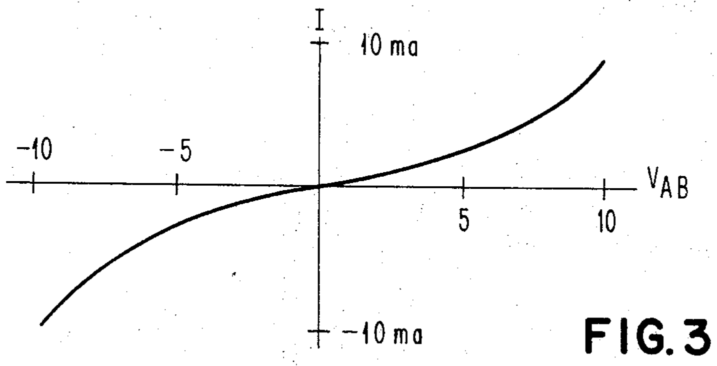
FIG. 3 is a current versus voltage chracteristic curve for the pair of back-to-back Schottky barrier diodes illustrated in FIGS. 1 and 2 and illustrates the normal electrical characteristics for the devices.

As is well known and generally expected from a pair of Schottky barrier diodes such as 20 and 22, they possess electrical characteristics as shown by the voltage-current plot illustrated in FIG. 3. That is, FIG. 3 represents the normal non-destructive breakdown curve for a pair of back-to-back Schottky barrier diodes. The FIG. 3 curve clearly indicates that normally a pair of back-to-back Schottky barrier diodes exhibits a non-linear impedance and thus it is incapable of storing information.

Figure 4:
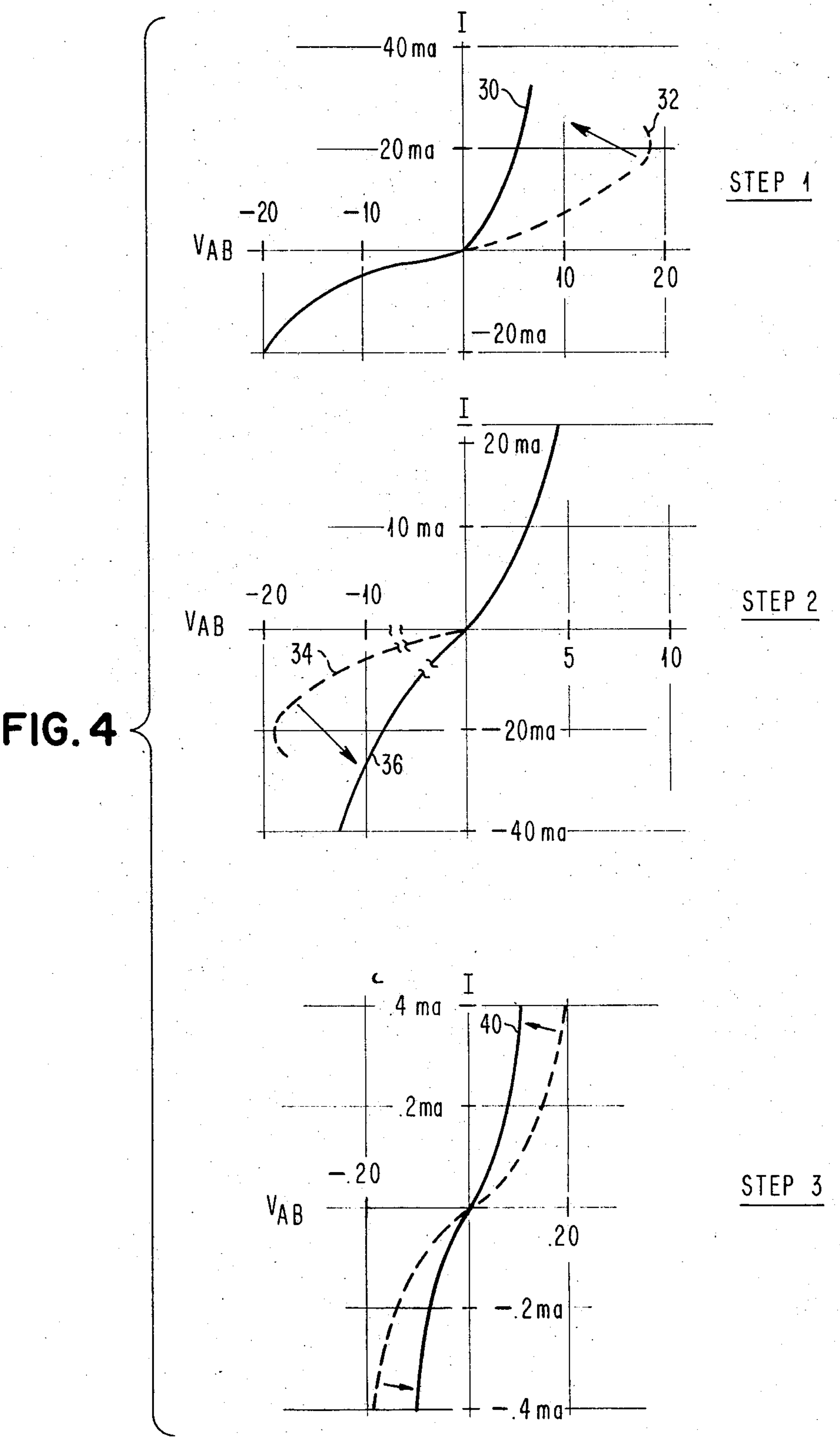
FIG. 4 illustrates the electrical characteristic manifestations resulting from a sequence of process steps performed on the structure illustrated in FIGS. 1 and 2.

FIG. 4 illustrates a series of steps, manifested by the resulting change in electrical characteristics, used to alter the conventional pair of back-to-back Schottky barrier devices illustrated in FIGS. 1 and 2 in order to form an entirely new device capable of functioning as a bistable non-volatile storage element.

In the first step, a voltage is applied at terminal A, positive with respect to terminal B, of approximately 20 volts. This voltage is increased slowly from 0 volts until the first quadrant characteristic "snaps" to a lower resistivity state illustrated by the first quadrant curve 30. In other words, as current is passed from terminal A to B, the conventional state of the pair of devices 20 and 22 is modified from its normal first quadrant state illustrated by the dotted curve 32 to an altered position shown by curve 30.

In step 2, the procedure of step 1 is reversed. That is, a voltage is applied to terminal B, positive with respect to terminal A, so as to pass current from terminal B to terminal A. For the particular devices fabricated according to the abovementioned process, it is found that the intermediate alterable process step is most suitably accomplished by raising the voltage from 0 to approximately 20 volts in a gradual manner so as to pass current from terminal B to terminal A. As a result of this step, the characteristics of the back-to-back diodes 20 and 22 "snaps" from its normal state indicated by dotted curve 34 to an intermediate alterable state in the third quadrant indicated by curve 36.

In step 3, the alteration of the device is completed by a final personalization step which writes a binary 1 or permanently alters the pair of devices to a low resistivity state. During this time, a positive potential with respect to terminal B is applied to terminal A. The applied potential is adjusted to consume approximately 300 milliwatts of power. This final step establishes a low resistance state for the newly formed non-volatile bistable device and is represented by the solid curve 40 in step 3.

The physical transformation or phenomena which occurs to form the resulting non-volatile bistable device is not fully understood at this time. It has been suggested that the non-volatile bistable characteristics result due to the interraction of the two Schottky barrier diodes and an attendant charge transfer under a high power state. It has also been postulated that the application of the current exercises the known devices so as to form a heterojunction. Another theory to explain the non-volatile bistable characteristics of the newly formed device proposes that a tunnelling filament in the range of a micron is formed during the process steps.

In any event, the three process steps illustrated by the resulting change in electrical characteristics result in the formation of an entirely new device having a low resistive state which is symmetrical in both the first and third quadrants, as illustrated by curve 40 in the step 3 process step.

After the newly formed device is set to a low impedance state, the power can be removed from the device and the non-volatile storage element remains in that state for many hours after all power is removed.

Figure 6:
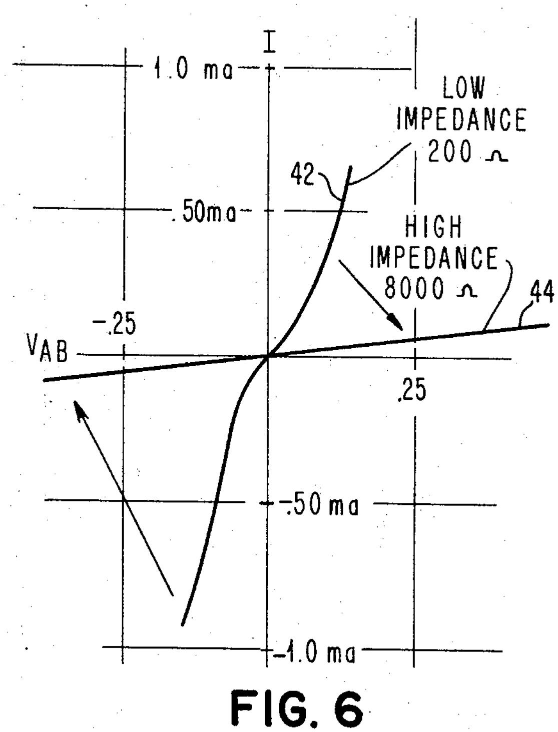
FIG. 6 illustrates the resulting electrical characteristics for the non-volatile bistable storage element fabricated according to the process steps of the present invention.

Now referring to FIG. 6, it illustrates the manner of setting the non-volatile bistable storage element to a high impedance state corresponding to writing a binary 0. Again, curve 42 illustrates its low impedance state and has been measured at approximately 200 ohms for this illustrated embodiment. The bistable non-volatile storage element is switched to a high impedance state by applying a positive potential to terminal B with respect to terminal A. The high impedance state is illustrated by curve 44 which is a substantially straight line, symmetrical in the first and third quadrants. Actual measurements showed the high impedance state to be in the range of 8000 ohms and which constitutes an impedance transformation ratio of about 40 between the high and low impedance states.

It is significant to note that the resulting non-volatile bistable storage element possesses symmetrical characteristics in both the high and low impedance state. As a result, layout, device design, and fabrication of the storage element in monolithic form is simplified. Also, this characteristic allows the device to be readily intermixed with other electrical components because of the necessity of matching terminal impedances, voltages, and currents from a circuit design standpoint.

Although the invention has been particularly shown and described with reference to the preferred embodiment thereof, it will be understood by those skilled in the art that the foregoing and other changes in form and details may be made therein without departing from the spirit and scope of the invention.

What is claimed is:

1. A non-volatile bistable storage device formed by:

a. forming a pair of back-to-back metal Schottky barrier diodes on a substrate, b. selectively passing current between the pair of Schottky barrier diodes for forming a high and a low bistable impedance device storage element, c. said forming step comprising fabricating a pair of Schottky barrier diodes by selectively deposting metal on a silicon substrate so as to interconnect respective cathode terminals, and provide a current path between respective anode terminals, and d. said passing step comprising firstly passing current in one direction between the respective anode terminals soas to alter the first quadrant impedance state of said back-to-back Schottky barrier diodes for forming an altered device, passing current in an opposite direction between the anode terminals so as to alter the third quadrant impedance state of said altered device for forming a newly altered device, and then passing current in said one direction so as to simultaneously alter the first and third quadrant impedance states of said newly altered device for forming a high and low bistable impedance device storage element.

2. A process for forming a non-volatile bistable storage element comprising the steps of:

a. forming a pair of back-to-back metal Schottky barrier diodes by selectively depositing metal on a semiconductor substrate, b. selectively and sequentially passing different values of current in opposite directions between the pair of respective anode terminals associated with said back-to-back Schottky barrier diodes for forming between the pair of respected anode terminals a high and a low impedance non-volatile bistable storage element.

3. A process for forming a non-volatile bistable storage element as in claim 2 comprising the steps of:

a. selectively passing a first predetermined value of current in a first direction between said pair of anode terminals so as to alter the first quadrant impedance of said back-to-back Schottky barrier diodes for forming an altered device, b. selectively passing a second predetermined value of current in an opposite direction to said first direction between said anode terminals so as to alter the third quadrant impedance of said altered device for forming a newly altered device, and c. selectively passing a third predetermined value of current in said first direction between said anode terminals so as to simultaneously alter the first and third quadrant impedance of said newly altered device for forming a non-volatile bistable storage device having a high and a low impedance state.

4. A process for forming a non-volatile bistable storage element as in claim 3 comprising the step of:

a. forming said pair of Schottky barrier diodes on a silicon substrate.

5. A process for forming a non-volatile bistable storage element as in claim 4 comprising the step of:
   a. forming said pair of Schottky barrier diodes by selectively depositing metal on a silicon substrate.

6. A process for forming a non-volatile bistable storage element as in claim 5 comprising the step of:
   a. depositing metal on said silicon substrate so as to directly interconnect the respective cathode terminals of said pair of back-to-back Schottky barrier diodes.

7. A process for forming a non-volatile bistable storage element as in claim 6 comprising the step of:
   a. forming a pair of interconnection temrinals to the respective anode terminals of said back-to-back Schottky barrier diodes so as to form a current path between said interconnection terminals.

* * * * *